(12) United States Patent
Han et al.

(10) Patent No.: US 8,932,947 B1
(45) Date of Patent: Jan. 13, 2015

(54) METHODS FOR FORMING A ROUND BOTTOM SILICON TRENCH RECESS FOR SEMICONDUCTOR APPLICATIONS

(71) Applicants: Joo Won Han, Santa Clara, CA (US); Kee Young Cho, San Jose, CA (US); Han Soo Cho, San Jose, CA (US); Sang Wook Kim, Palo Alto, CA (US); Anisul H. Khan, Santa Clara, CA (US)

(72) Inventors: Joo Won Han, Santa Clara, CA (US); Kee Young Cho, San Jose, CA (US); Han Soo Cho, San Jose, CA (US); Sang Wook Kim, Palo Alto, CA (US); Anisul H. Khan, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/948,269

(22) Filed: Jul. 23, 2013

(51) Int. Cl.
   H01L 21/302 (2006.01)
   H01L 21/762 (2006.01)
   H01L 21/768 (2006.01)
   H01L 21/311 (2006.01)
   H01L 21/3065 (2006.01)

(52) U.S. Cl.
   CPC ........ *H01L 21/762* (2013.01); *H01L 21/76898* (2013.01); *H01L 21/31116* (2013.01); *H01L 21/30655* (2013.01); *H01L 21/3065* (2013.01)
   USPC ........... 438/589; 438/700; 438/710; 438/714; 438/719; 257/E21.218; 257/E21.252

(58) Field of Classification Search
   CPC ............... H01L 21/3065; H01L 21/30655; H01L 21/76898; H01L 21/31116
   USPC ................ 438/700, 710, 714, 713, 719, 589; 257/E21.218, E21.252
   See application file for complete search history.

(56) References Cited

U.S. PATENT DOCUMENTS

| | | |
|---|---|---|
| 5,071,714 A | 12/1991 | Rodbell et al. |
| 5,110,408 A | 5/1992 | Fujii et al. |
| 5,188,979 A | 2/1993 | Filipiak |
| 5,200,028 A | 4/1993 | Tatsumi |
| 5,337,207 A | 8/1994 | Jones et al. |
| 5,356,833 A | 10/1994 | Maniar et al. |
| 5,391,244 A | 2/1995 | Kadomura |
| 5,674,782 A | 10/1997 | Lee et al. |
| 6,184,072 B1 | 2/2001 | Kaushik et al. |
| 6,187,685 B1 * | 2/2001 | Hopkins et al. ............... 438/710 |
| 6,204,141 B1 | 3/2001 | Lou |
| 6,270,568 B1 | 8/2001 | Droopad et al. |
| 6,297,095 B1 | 10/2001 | Muralidhar et al. |
| 6,300,202 B1 | 10/2001 | Hobbs et al. |
| 6,319,730 B1 | 11/2001 | Ramdani et al. |
| 6,323,143 B1 | 11/2001 | Yu |
| 6,326,261 B1 | 12/2001 | Tsang et al. |
| 6,348,386 B1 | 2/2002 | Gilmer |
| 6,855,643 B2 | 2/2005 | Nallan et al. |
| 6,979,652 B2 * | 12/2005 | Khan et al. .................... 438/700 |

(Continued)

*Primary Examiner* — Michael Trinh
(74) *Attorney, Agent, or Firm* — Patterson & Sheridan, LLP

(57) ABSTRACT

Embodiments of the present invention provide methods to etching a recess channel in a semiconductor substrate, for example, a silicon containing material. In one embodiment, a method of forming a recess structure in a semiconductor substrate includes transferring a silicon substrate into a processing chamber having a patterned photoresist layer disposed thereon exposing a portion of the substrate, providing an etching gas mixture including a halogen containing gas and a $Cl_2$ gas into the processing chamber, supplying a RF source power to form a plasma from the etching gas mixture, supplying a pulsed RF bias power in the etching gas mixture, and etching the portion of the silicon substrate exposed through the patterned photoresist layer in the presence of the plasma.

20 Claims, 4 Drawing Sheets

(56) References Cited

U.S. PATENT DOCUMENTS

| | | | |
|---|---|---|---|
| 2001/0051438 A1* | 12/2001 | Shin et al. | 438/706 |
| 2002/0148807 A1* | 10/2002 | Zhao et al. | 216/2 |
| 2007/0099384 A1* | 5/2007 | Han et al. | 438/270 |
| 2007/0254465 A1* | 11/2007 | Jung | 438/589 |

* cited by examiner

METHODS FOR FORMING A ROUND BOTTOM SILICON TRENCH RECESS FOR SEMICONDUCTOR APPLICATIONS

BACKGROUND

1. Field

Embodiments of the present invention generally relate to a method for forming a round bottom silicon trench recess, more specifically, to a method for forming a round bottom silicon trench recess in semiconductor fabrication applications.

2. Description of the Related Art

Reliably producing submicron and smaller features is one of the key technologies for the next generation of very large scale integration (VLSI) and ultra large scale integration (ULSI) of semiconductor devices. However, as the miniaturization of circuit technology is pressed, the shrinking dimensions of interconnects in VLSI and ULSI technology have placed additional demands on the processing capabilities. The multilevel interconnects that lie at the heart of this technology require precise processing of high aspect ratio features, such as vias and other interconnects. Reliable formation of these interconnects is very important to VLSI and ULSI success and to the continued effort to increase circuit density and quality of individual substrates.

As circuit densities increase for next generation devices, the integration densities have been increased by decreasing transistor feature sizes, including gate length and channel length. Decreased channel length may result in short channel effects, which may increase an off-current threshold of the transistors ad can deteriorate refresh characteristics of memory devices having such transistors. In order to eliminate such problems, forming a recess channel for semiconductor device manufacture has been introduced to extend the channel length of the transistors. The recess channel increases a channel length and reduces an ion-implantation concentration, thereby improving a refresh property of the semiconductor device.

In some instances, recess channels may also be configured to have different shapes or features formed within a trench, instead of conventional vertical only trench shapes, so as to further increase surface area or length of the channels to further improve refresh properties. However, formation of such shapes or features often require complicated and multiple process steps to complete the manufacture process, resulting in increases of manufacturing cycle time and cost with decreased process throughput. Furthermore, poor etching selectivity and control occurring during manufacturing processes for such shapes or features in the recess channels may undesirably result in an inaccurate profile control, thereby eventually leading to device failure.

Thus, there is a need for a channel recess etch process for etching a recess area in a semiconductor substrate with low cost and precise process control.

SUMMARY

Embodiments of the present invention provide methods for etching a recess channel in a semiconductor substrate, for example, a silicon containing material. In one embodiment, a method of forming a recess structure in a semiconductor substrate includes transferring a silicon substrate into a processing chamber having a patterned photoresist layer disposed thereon exposing a portion of the substrate, providing an etching gas mixture including a halogen containing gas and a $Cl_2$ gas into the processing chamber, supplying a RF source power to form a plasma from the etching gas mixture, supplying a pulsed RF bias power in the etching gas mixture, and etching the portion of the silicon substrate exposed through the patterned photoresist layer in the presence of the plasma.

In another embodiment, a method of forming a recess structure in a semiconductor substrate includes providing a silicon substrate into a processing chamber, wherein the silicon substrate has a patterned photoresist layer disposed thereon, exposing an active region formed in the silicon substrate, wherein the active region is defined between shallow trench isolations (STI) in the silicon substrate, supplying an etching gas mixture in the processing chamber, supplying a RF source power to form a plasma from the etching gas mixture, performing an anisotropic etching process by applying a RF bias power in the etching gas mixture, and performing an isotropic etching process by turning off the RF bias power in the etching gas mixture.

In yet another embodiment, a method of forming a recess structure in a semiconductor substrate includes providing a silicon substrate into a processing chamber, wherein the silicon substrate has a patterned photoresist layer disposed thereon, exposing an active region formed in the silicon substrate, wherein the active region is defined between shallow trench isolations (STI) in the silicon substrate, etching the active region in the silicon substrate with a RF bias power on to form a trench in the active region, and continuously etching the active region in the silicon substrate with the RF bias off to form a round feature to a bottom of the trench in the active region.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention provides a method and apparatus for manufacturing a recess channel structure in a semiconductor substrate. More specifically, the invention relates to methods of utilizing a single etching step to manufacture a recess channel structure in a semiconductor substrate in semiconductor device applications. In one embodiment, the recess channel structure with a round bottom feature, e.g., a spherical-like structure, formed at a bottom of a trench is formed by using a single etching step to etch a silicon material defining the semiconductor substrate. The single etching step utilizes a pulsed RF bias power mode to incrementally etch the round bottom feature at the bottom of the trench, thereby forming a channel recess with round bottom feature, e.g., a spherical-like structure, in the semiconductor substrate.

Figure 1:
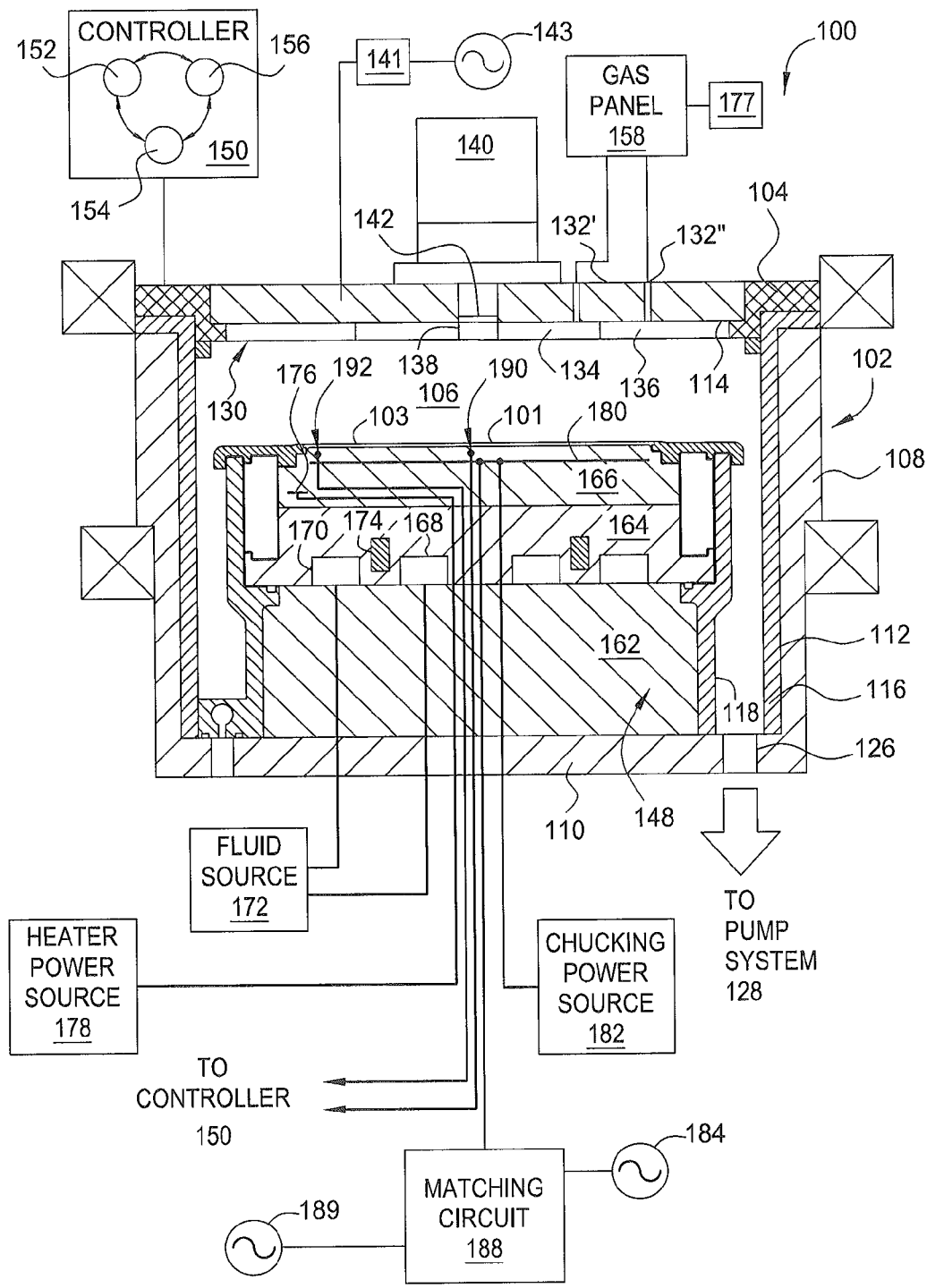
FIG. 1 depicts a schematic cross-sectional view of a processing chamber that may be utilized to fabricate a recess channel structure in a semiconductor substrate in accordance with embodiments of the present invention.

FIG. 1 is a sectional view of one embodiment of a processing chamber 100 suitable for manufacturing a recess channel structure in a semiconductor substrate. Suitable processing chambers that may be adapted for use with the teachings disclosed herein include, for example, a ENABLER® processing chamber, Decoupled Plasma Source (DPS®) II reactor, or other suitable reactors, available from Applied Materials, Inc. of Santa Clara, Calif. The particular embodiment of the processing chamber 100 shown herein is provided for illustrative purposes and should not be used to limit the scope of the invention. It is contemplated that the invention may be utilized in other plasma processing chambers, including those from other manufacturers.

The processing chamber 100 includes a chamber body 102 and a lid 104 which together enclose an interior volume 106. The chamber body 102 is typically fabricated from aluminum, stainless steel or other suitable material. The chamber body 102 generally includes sidewalls 108 and a bottom 110. A substrate access port (not shown) is generally defined in a sidewall 108 and a selectively sealed by a slit valve to facilitate entry and egress of a substrate 101 from the processing chamber 100. An exhaust port 126 is defined in the chamber body 102 and couples the interior volume 106 to a pump system 128. The pump system 128 generally includes one or more pumps and throttle valves utilized to evacuate and regulate the pressure of the interior volume 106 of the processing chamber 100. In one embodiment, the pump system 128 maintains the pressure inside the interior volume 106 at operating pressures typically between about 10 mTorr to about 20 Torr.

The lid 104 is sealingly supported on the sidewall 108 of the chamber body 102. The lid 104 may be opened to allow excess to the interior volume 106 of the processing chamber 100. The lid 104 includes a window 142 that facilitates optical process monitoring. In one embodiment, the window 142 is comprised of quartz or other suitable material that is transmissive to a signal utilized by an optical monitoring system 140.

The optical monitoring system 140 is positioned to view at least one of the interior volume 106 of the chamber body 102 and/or the substrate support pedestal assembly 148 positioned on a substrate support pedestal assembly 148 through the window 142. In one embodiment, the optical monitoring system 140 is coupled to the lid 104 and facilitates an integrated deposition process that uses optical metrology to provide information that enables process adjustment to compensate for incoming substrate pattern feature inconsistencies (such as thickness, and the like), provide process state monitoring (such as plasma monitoring, temperature monitoring, and the like) as needed. One optical monitoring system that may be adapted to benefit from the invention is the EyeD® full-spectrum, interferometric metrology module, available from Applied Materials, Inc., of Santa Clara, Calif.

A gas panel 158 is coupled to the processing chamber 100 to provide process and/or cleaning gases to the interior volume 106. In the embodiment depicted in FIG. 1, inlet ports 132', 132" are provided in the lid 104 to allow gases to be delivered from the gas panel 158 to the interior volume 106 of the processing chamber 100.

A showerhead assembly 130 is coupled to an interior surface 114 of the lid 104. The showerhead assembly 130 includes a plurality of apertures that allow the gases flowing through the showerhead assembly 130 from the inlet ports 132', 132" into the interior volume 106 of the processing chamber 100 in a predefined distribution across the surface of the substrate support pedestal assembly 148 being processed in the processing chamber 100.

A remote plasma source 177 may be coupled to the gas panel 158 to facilitate dissociating gas mixture from a remote plasma prior to entering into the interior volume 106 for processing. A RF source power 143 is coupled through a matching network 141 to the showerhead assembly 130. The RF source power 143 typically is capable of producing up to about 3000 W at a tunable frequency in a range from about 50 kHz to about 13.56 MHz.

The showerhead assembly 130 additionally includes a region transmissive to an optical metrology signal. The optically transmissive region or passage 138 is suitable for allowing the optical monitoring system 140 to view the interior volume 106 and/or substrate 101 positioned on the substrate support pedestal assembly 148. The passage 138 may be a material, an aperture or plurality of apertures formed or disposed in the showerhead assembly 130 that is substantially transmissive to the wavelengths of energy generated by, and reflected back to, the optical monitoring system 140. In one embodiment, the passage 138 includes a window 142 to prevent gas leakage from the passage 138. The window 142 may be a sapphire plate, quartz plate or other suitable material. The window 142 may alternatively be disposed in the lid 104.

In one embodiment, the showerhead assembly 130 is configured with a plurality of zones that allow for separate control of gas flowing into the interior volume 106 of the processing chamber 100. In the embodiment FIG. 1, the showerhead assembly 130 has an inner zone 134 and an outer zone 136 that are separately coupled to the gas panel 158 through separate inlets 132', 132".

The substrate support pedestal assembly 148 is disposed in the interior volume 106 of the processing chamber 100 below the showerhead assembly 130. The substrate support pedestal assembly 148 holds the substrate 101 during processing. The substrate support pedestal assembly 148 generally includes a plurality of lift pins (not shown) disposed therethrough that are configured to lift the 101 from the substrate support pedestal assembly 148 and facilitate exchange of the substrate 101 with a robot (not shown) in a conventional manner. An inner liner 118 may closely circumscribe the periphery of the substrate support pedestal assembly 148.

In one embodiment, the substrate support pedestal assembly 148 includes a mounting plate 162, a base 164 and an electrostatic chuck 166. The mounting plate 162 is coupled to the bottom 110 of the chamber body 102 and includes passages for routing utilities, such as fluids, power lines and sensor leads, among others, to the base 164 and the electrostatic chuck 166. The electrostatic chuck 166 comprises at least one clamping electrode 180 for retaining a substrate support pedestal assembly 148 below showerhead assembly 130. The electrostatic chuck 166 is driven by a chucking power source 182 to develop an electrostatic force that holds the substrate support pedestal assembly 148 to the chuck surface, as is conventionally known. Alternatively, the substrate support pedestal assembly 148 may be retained to the substrate support pedestal assembly 148 by clamping, vacuum or gravity.

At least one of the base 164 or electrostatic chuck 166 may include at least one optional embedded heater 176, at least one optional embedded isolator 174 and a plurality of conduits 168, 170 to control the lateral temperature profile of the substrate support pedestal assembly 148. The conduits 168, 170 are fluidly coupled to a fluid source 172 that circulates a temperature regulating fluid therethrough. The heater 176 is regulated by a power source 178. The conduits 168, 170 and heater 176 are utilized to control the temperature of the base 164, thereby heating and/or cooling the electrostatic chuck 166, and thereby facilitating the operative control of the substrate 101. The temperature of the electrostatic chuck 166 and the base 164 may be monitored using a plurality of temperature sensors 190, 192. The electrostatic chuck 166 may further comprise a plurality of gas passages (not shown), such as grooves, that are formed in a substrate support pedestal supporting surface of the chuck 166 and fluidly coupled to a source of a heat transfer (or backside) gas, such as He. In operation, the backside gas is provided at controlled pressure into the gas passages to enhance the heat transfer between the electrostatic chuck 166 and the substrate support pedestal assembly 148.

In one embodiment, the substrate support pedestal assembly 148 is configured as a cathode and includes an electrode 180 that is coupled to a RF power bias source 184. The RF bias power source 184 is coupled between the electrode 180 disposed in the pedestal assembly 148 and another electrode, such as the showerhead assembly 130 or lid 104 of the chamber body 102. The RF bias power excites and sustains a plasma discharge formed from the gases disposed in the processing region of the chamber body 102. In the embodiment depicted in FIG. 1, the RF bias power source 184 is coupled to the electrode 180 disposed in the pedestal assembly 148 through a matching network 188. The signal generated by the RF bias power source 184 is delivered through matching network 188 to the substrate support pedestal assembly 148 through a single feed to ionize the gas mixture provided in the plasma processing chamber 100, thereby providing ion energy necessary for performing a deposition or other plasma enhanced process. The RF bias power source 184 is generally capable of producing an RF signal having a frequency of from about 50 kHz to about 200 MHz and a power between about 0 Watts and about 5000 Watts. An additional bias power source 189 may be coupled to the electrode 180 to control the characteristics of the plasma. It is noted that although the example depicted in FIG. 1 includes one RF bias power source 184 and an additional optional RF bias power source 189, it is noted that the RF bias power included in the processing chamber 100 may be in any number as needed.

In one mode of operation, the substrate 101 is disposed on the substrate support pedestal assembly 148 in the plasma processing chamber 100. A process gas and/or gas mixture is introduced into the chamber body 102 through the showerhead assembly 130 from the gas panel 158. Furthermore, additional gases may be supplied from the remote plasma source 177 through the showerhead assembly 130 to the processing chamber 100. A vacuum pump system 128 maintains the pressure inside the chamber body 102 while removing deposition by-products. The vacuum pump system 128 typically maintains an operating pressure between about 10 mTorr to about 20 Torr.

The RF source power 143 and the RF bias power sources 184, 189 provide RF source and bias power at separate frequencies to the anode and/or cathode through the matching network 141 and 188 respectively, thereby providing energy to form the plasma and excite the gas mixture in the chamber body 102 into ions to perform a plasma process.

A controller 150 is coupled to the processing chamber 100 to control operation of the processing chamber 100. The controller 150 includes a central processing unit (CPU) 152, a memory 154, and a support circuit 156 utilized to control the process sequence and regulate the gas flows from the gas panel 158. The CPU 152 may be any form of general purpose computer processor that may be used in an industrial setting. The software routines can be stored in the memory 154, such as random access memory, read only memory, floppy, or hard disk drive, or other form of digital storage. The support circuit 156 is conventionally coupled to the CPU 152 and may include cache, clock circuits, input/output systems, power supplies, and the like. Bi-directional communications between the controller 150 and the various components of the processing chamber 100 are handled through numerous signal cables.

FIG. 1 only shows one exemplary configuration of various types of plasma processing chamber that can be used to practice the invention. For example, different types of microwave power, magnetic power and bias power can be coupled into the plasma chamber using different coupling mechanisms. In some applications, different types of plasma may be generated in a different chamber from the one in which the substrate is located, e.g., remote plasma source, and the plasma subsequently guided into the chamber using techniques known in the art.

Figure 2:
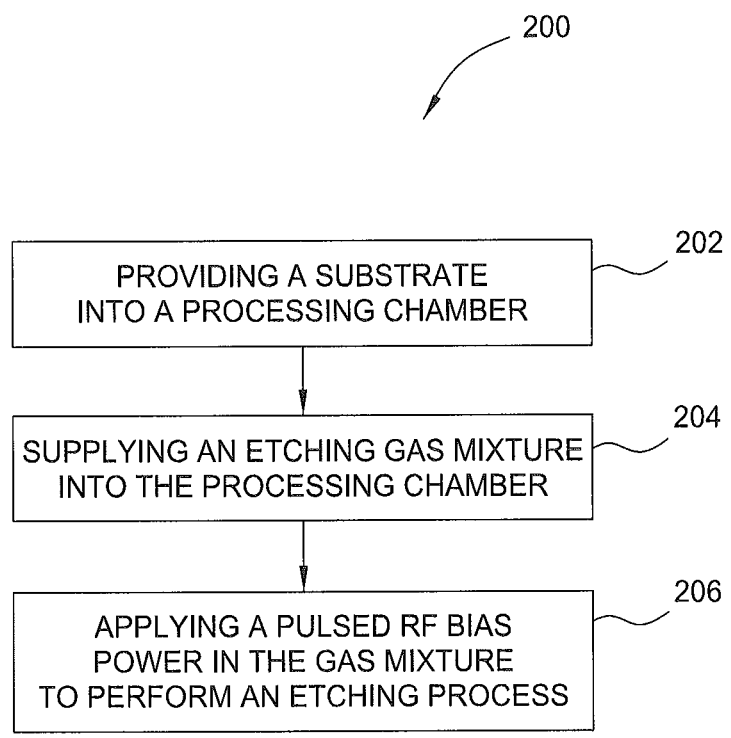
FIG. 2 depicts a flow diagram of a method for manufacturing a recess channel structure in a semiconductor substrate in accordance with embodiments of the present invention.

FIG. 2 is a flow diagram of a method 200 for manufacturing a recess channel structure 313 in a semiconductor substrate, which may be performed in a processing chamber, such as the processing chamber 100 depicted in FIG. 1. FIGS. 3A-3D are schematic cross-sectional views illustrating a sequence for manufacturing the recess channel structure in the semiconductor substrate, such as the substrate 101, depicted in FIG. 1, according to the method 200. Although the method 200 is described below with reference to a semiconductor substrate utilized to fabricate a channel recess structure with round bottom features, the method 200 may also be used to advantage in other trench recess process, such as recess for shallow trench isolations (STI) or any other suitable structures for semiconductor device fabrications.

The method 200, which may be stored in computer readable form in the memory 154 of the controller 150 or other storage medium, begins at block 202 when the substrate 101 is transferred to and placed on the substrate support pedestal assembly 148 disposed in the processing chamber 100, as depicted in FIG. 1.

Figure 3A:
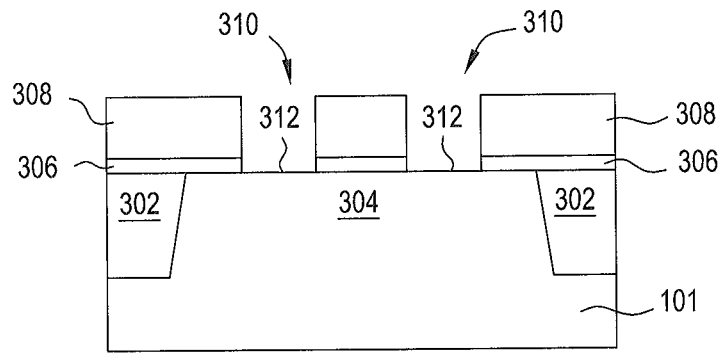
FIGS. 3A-3D depict a sequence for manufacturing a recess channel structure in a semiconductor substrate of FIG. 2.

The substrate 101 may have shallow trench isolation (STI) 302 formed in the substrate 101 defining an active region 304 in between the shallow trench isolation (STI) 302, as shown in FIG. 3A. The active region 304 may include different types of active dopants doped in silicon materials, such as a single crystalline silicon, from the substrate 101. A patterned photoresist layer 308 along with a patterned hardmask layer 306 may be disposed on the substrate 101 with defined openings 310 in the patterned photoresist layer 308 and the patterned hardmask layer 306, exposing a surface 312 of the active region 304 for processing. The patterned photoresist layer 308 may comprise any suitable photosensitive resist materials, such as an e-beam resist (for example, a chemically amplified resist (CAR)), and deposited and patterned in any suitable manner. The patterned photoresist layer 308 may be deposited to a thickness between about 100 nm and about 3000 nm. The hardmask layer 306 may be any suitable dielectric materials, such as amorphous carbon, silicon oxide, silicon nitride, silicon oxynitride, silicon carbide, combinations thereof, and the like. In one particular embodiment, the hardmask layer 306 may include an amorphous carbon layer, or combinations of amorphous carbon layer and silicon oxide layer.

In one embodiment, the substrate 101 may have a substantially planar surface, an uneven surface, or a substantially planar surface having a structure formed thereon. The substrate 101 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 101 may have various dimensions, such as 200 mm, 300 mm, 450 mm or other diameter wafers, as well as rectangular or square panels. Unless otherwise noted, embodiments and examples described herein are conducted on substrates having a diameter between about 200 mm and about 500 mm. In the embodiment wherein a SOI structure is utilized for the substrate 101, the substrate 101 may include a buried dielectric layer disposed on a silicon crystalline substrate. In the embodiment depicted herein, the substrate 101 may be a crystalline silicon substrate. The photoresist layer 308 and the hardmask layer 306 may be patterned by any suitable patterning techniques.

Figure 3B:
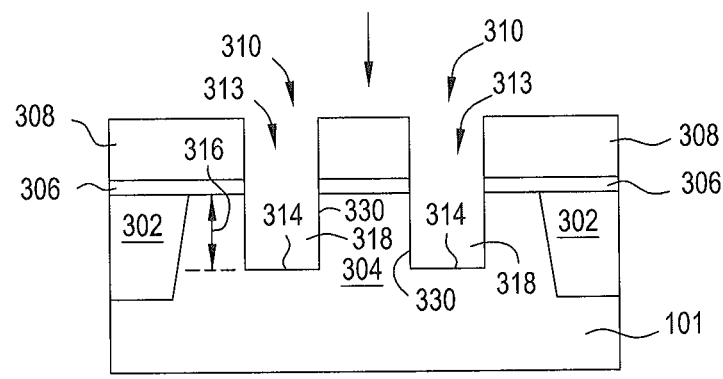

At block 204, an etching gas mixture is supplied into the processing chamber 100 to etch portions of the surface 312 of the active region 304 defined in the substrate 101 exposed by the patterned photoresist layer 308 and the hardmask layer 306, as shown in FIG. 3B. In some embodiments, the hardmask layer 306 may be patterned/etched together with the active region 304 continuously in a single chamber with the same process step, such as a single etchant chemistry, or separately etched by multiple steps in one or different etching processes as needed. The patterns/openings 310 from the photoresist layer 308 and the hardmask layer 306 are then transferred into the active region 304 through the etching process.

In one embodiment, the etching gas mixture supplied to etch the active region 304 in the semiconductor substrate 101 includes at least one halogen containing gas and a chlorine containing gas. Suitable examples of the halogen containing gas include HBr, $CF_4$, $CHF_3$, $CH_2F_2$, $C_2F_6$, $C_2F_8$, $C_4F_6$, $SF_6$, $NF_3$, and the like. Suitable examples of the chlorine containing gas include HCl, $Cl_2$, and the like. In some embodiments, HBr and $Cl_2$ are supplied in the etching gas mixture. Some halogen containing gases with carbon elements formed therein may also be utilized in the etching gas mixture. Halogen containing gases with carbon elements (e.g., a carbon and halogen containing gas) formed therein that may be supplied in the etching gas mixture include $CF_4$, $CHF_3$, $CH_2F_2$, $C_2F_6$, $C_2F_8$, $C_4F_6$ and the like.

In one example, $CF_4$, $CHF_3$ may be supplied with the HBr and $Cl_2$ gas in the etching gas mixture to etch the active region 304 to form desired features/openings, such as a trench 318, as part of a recess channel structure 313 in the substrate 101. As the fluorine, bromide and chlorine elements are aggressive etchants, these elements, included in the etching gas mixture, are utilized to etch away portions of the active region 304, forming the trench 318 in the active region 304 of the semiconductor substrate 101, as shown in FIG. 3B. Carbon elements from the $CF_4$, $CHF_3$ gas may provide a polymer source to assist passivating sidewalls 330 of the trench 318.

In an alternative embodiment, an inert gas may also be supplied as part of the etching gas mixture to assist the profile control as needed. Examples of the inert gas supplied in the gas mixture include Ar, He, Ne, Kr, Xe or the like.

In one embodiment, HBr gas and $Cl_2$ gas supplied in the etching gas mixture may be maintained at a predetermined ratio to yield an efficient etching rate. Carbon and halogen containing gas are supplied to protect the sidewalls from undesired etching. In an exemplary embodiment, the HBr gas and $Cl_2$ gas are supplied in the etching gas mixture at a $HBr:Cl_2$ ratio of between about 5:1 and about 1:5. Alternatively, HBr gas may be supplied at a flow rate by volume between about 5 sccm and about 70 sccm. $Cl_2$ gas may be supplied at a flow rate by volume between about 5 sccm and about 70 sccm.

Additionally, $CF_4$ gas and $CHF_3$ gas are supplied in the etching gas mixture at a $CHF_3:CF_4$ ratio of between about 5:1 to about 10:1. Alternatively, $CF_4$ gas may be supplied at a flow rate by volume between about 10 sccm and about 100 sccm. $CHF_3$ gas may be supplied at a flow rate by volume between about 30 sccm and about 200 sccm.

At block 206, after the etching gas mixture is supplied into the etching gas mixture, a RF source power and a pulsed RF bias power are supplied to form a plasma from the gas mixture to form the trenches 318 in the active region 304 of the substrate 101. The RF power, including source and bias power, may be applied to the processing chamber to ignite a plasma in the etching gas mixture. In one embodiment, the RF bias power may be set to a pulsed mode, intermittently applying RF bias power over different time periods during the etching process. The RF bias power may maintain in the pulsed mode and intermittently applied into the processing chamber until the predetermined process time period is expired.

Figure 3C:
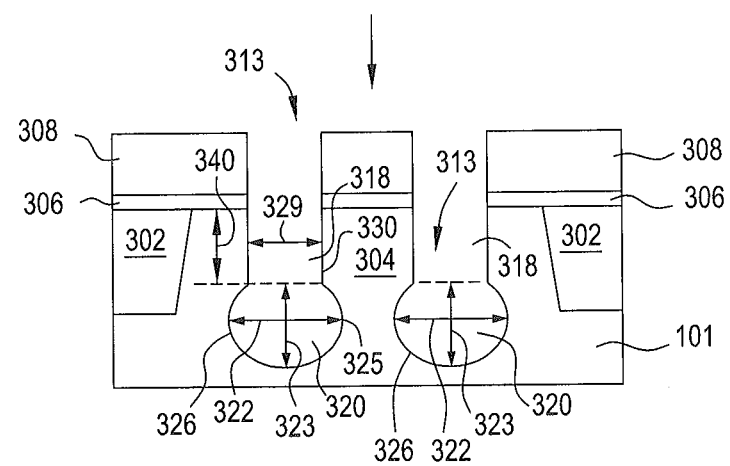

It is believed that utilizing pulse mode for applying RF bias power to produce plasma in the gas mixture may assist producing alternating isotropic and anisotropic etching process during the overall etching process. Pulsed RF bias power mode may maintain the RF bias power in an "on-off" pulsed mode. In the period when the RF bias power is on, ions, radicals, or active species generated in the plasma become directional and may be accelerated toward the substrate, performing an anisotropic etching process, e.g., with directional ions, radicals, or active species generated in the plasma, to etch the trench 318 with substantially vertical sidewalls 330 (i.e., with a specific controlled direction) at a predetermined length 316, as shown in FIG. 3B. Subsequently, in the period when the RF bias power is off, ions, radicals, or active species may be uniformly distributed in the plasma, gradually falling onto the substrate without specific directionality, performing an isotropic etching process, e.g., with non-directional ions, to etch the substrate 101. The isotropic etching process further etches the recess channel structure 313 outward of the sidewalls 330, forming a round bottom feature 320 connecting to the vertical sidewall 330 of the recess channel structure 313, as shown in FIG. 3C. As the ions, radicals, or active species generated by the isotropic etching process (e.g., with RF pulsed power off) are with no specific directions, the reactive ions may scatter radially and symmetrically to chemically react with the silicon materials in the active region 304. Thus, the resultant round bottom feature 320 formed at the end of the recess channel structure 313 may have a lateral width 322 from a feature corner 325 of the round bottom feature 320 substantially similar to the vertical width 323 from a bottom 326 of the round bottom feature 320, due the isotropic nature of the non-directional etching process.

Figure 4A:
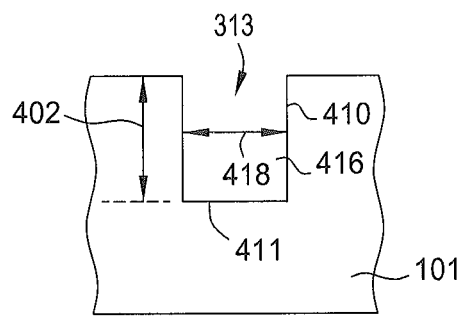
FIGS. 4A-4C depicts a flow diagram of magnified views of the recess channel structure formed in the semiconductor substrate depicted in FIGS. 3A-3C.
Figure 4B:
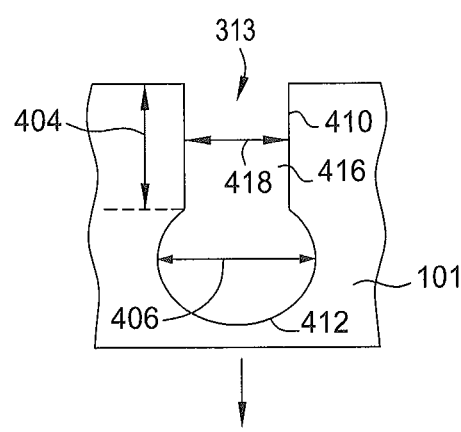
Figure 4C:
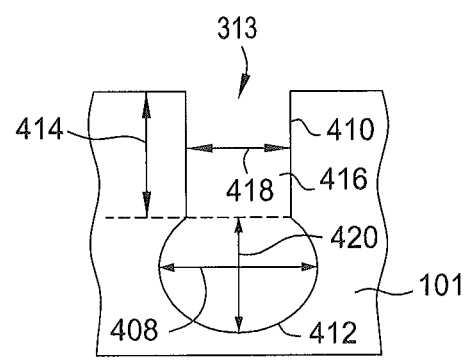

Referring first to FIGS. 4A-4C, the etching process with pulsed RF bias mode is performed to form a recess channel structure 313 in the substrate 101. When the etching process first starts, an anisotropic etching process with RF bias power on is performed for a first period of time to form a trench 416 with substantially vertical sidewalls 410 and a planar bottom 411 in the substrate 101 with a first width 418 and a first length 402, as shown in FIG. 4A. After the first predetermined period of time, the RF bias power is then switched to be maintained in an off state to perform an isotropic etching process. As discussed above, the isotropic etching process etches the substrate 101 radially and symmetrically from the bottom 411 of the trench 416, forming a bulb type, e.g., a sphere-like, round bottom feature 412 from the bottom 411 of the trench 416 with a first lateral width 406 that extends outward of the sidewalls 410, as shown in FIG. 4B.

During the isotropic etching process (e.g., with RF bias power off), as the reactive ions randomly attack silicon materials in the substrate 101 without specific directionality, the silicon materials from the sidewall 410 of the recess channel structure 313 along with the bottom 411 may both chemically react with the reactive ions. As the lateral width 406 of the round bottom feature 412 increases during the isotropic etching process, the first length 402 of the trench 416 may be reduced by the growth of the round bottom feature 412 to a second length 404. In the mean while, the carbon and halogen containing gas supplied in the etching gas mixture may provide a source of polymer protection, protecting sidewalls 410 of the trench 416 from being overly attacked. Thus, a desired vertical sidewall 410 of the trench 416 may be maintained even the length 404 of the trench 416 is shortened.

Subsequently, the pulsed mode of the RF bias power continues going on and off to interchangeably perform the anisotropic etching and isotropic etching process to the substrate 101. The RF bias power switching causes a vertical width 420 along with the lateral width 408 of the round bottom feature 412 to grow until a desired dimension of the vertical width 420 and the lateral width 408 is reached, as shown in FIG. 4C. Similarly, the second length 404 of the trench 416 may be further reduced to a third length 414 as the growing size of the round bottom feature 412 may unavoidably erode some length 414 of the trench 416. The width 418 of the trench is maintained substantially the same throughout the pulsed mode of the RF bias power etching process due to the polymer layer protection from the carbon and halogen containing gases supplied in the etching gas mixture.

Thus, by modulating the pulsed mode of the RF power applied to the etching gas mixture, the round bottom feature 412 extending outwards from the trench 416 with vertical profile, e.g., the recess channel structure 313, may be obtained. Unlike the conventional practice utilizing several process steps, likely including deposition processes and several steps of etching processes, to fabricate both the vertical trench 416 and the round bottom feature 412, a single etching process with modulated RF bias power pulsed mode as described herein may obtain the recess channel structure 313 with the desired vertical trench 416 and the round bottom feature 412 formed in-situ in an etching processing chamber.

Furthermore, it is believed that the flow rate of $Cl_2$ gas supplied in the gas mixture may also influence the formation of the round bottom feature 412. Higher chlorine gas flow ratio in the etching gas mixture (e.g., a higher gas flow rate of $Cl_2$ gas) assists providing aggressive etchants, e.g., chlorine ions, during the isotropic etching process, thereby expediting the round bottom feature formation process. In one embodiment, the flow rate of the chlorine gas is controlled to be supplied in the etching gas mixture at about 5 percent to about 20 percent by volume to the total flow rate, including all gases supplied, in the etching gas mixture.

Referring back to FIG. 3C, the number of the RF bias power pulses provided during the etching process may be increased as many times as needed until desired dimensions of the recess channel structure 313 is formed. In one embodiment, the RF bias power pulse may have a duty cycle between about 5 percent (e.g., 5 percent on and 95 percent off) to about 70 percent (e.g., 70 percent on and 50 percent off), such as between about 5 percent and about 50 percent, such as between about 15 percent to 45 percent, at a RF bias frequency between about 500 Hz and about 10 kHz. Alternatively, the cycle of the RF bias power pulsed into the processing chamber may be controlled by a predetermined number of time periods performed. For example, the RF bias power may be pulsed between about every 0.1 milliseconds and about every 10 milliseconds. It is noted that the duty cycle of the RF bias power pulsed into the processing chamber may be repeated as many times as needed.

In one embodiment, the RF bias power may be controlled at about less than 500 Watts, such as less than 350 Watts, and a RF bias frequency between about 500 Hz and about 10 kHz. While maintaining the RF bias power in a pulsed mode, the RF source power and the etching gas mixture may be continuously applied to maintain smooth switch/transition between the anisotropic etching process and the isotropic etching process. In one embodiment, the RF source power may be supplied at the gas mixture between about 100 Watts and about 3000 Watts and at a frequency between about 400 kHz and about 13.56 MHz.

In one particular embodiment, the RF source power is maintained at about 1500 Watts while the RF bias power is maintained at about 170 Watts. The RF source power frequency is controlled at about 13.56 Hz and the RF bias power frequency is controlled at about 13.56 MHz or 2 MHz.

Several process parameters may also be controlled while supplying the etching gas mixture and the pulsed RF bias power mode to perform the etching process. The pressure of the processing chamber may be controlled at between about 0.5 milliTorr and about 500 milliTorr, such as between about 1 milliTorr and about 100 milliTorr, for example about 20 milliTorr.

The etching process is performed to etch the substrate 101 until desired dimensions of the vertical trench 318 and the round bottom feature 320 is formed, as shown in FIG. 3C. In one embodiment, the vertical trench 318 may have a width 329 between about 10 nm and about 25 nm, and a length 340 between about 60 nm and about 150 nm. The round bottom feature 320 may have a vertical width 323 between about 15 nm and about 50 nm and a lateral width 322 between about 15 nm and about 35 nm. The end point of the etching process may be controlled by time mode or other suitable methods. For example, the etching process may be terminated after performing between about 50 seconds and about 500 seconds. In this particular embodiment, the etching process may be performed between about 1 seconds and about 1000 seconds. In another embodiment, the etching process may be terminated by determination from an endpoint detector, such as an OES detector or other suitable detector as needed.

After the desired profile and/or the structure is formed in the active region 304 of the substrate 101, the photoresist layer 308 along with the hardmask layer 306 may be removed. In one embodiment, the remaining photoresist layer 308 is removed by ashing. The removal process may be performed in-situ in the processing chamber 100 in which the etching method was performed. In the embodiment wherein the photoresist layer 314 is completely consumed during the etching process, the ashing or photoresist layer removal process may be eliminated.

Figure 3D:
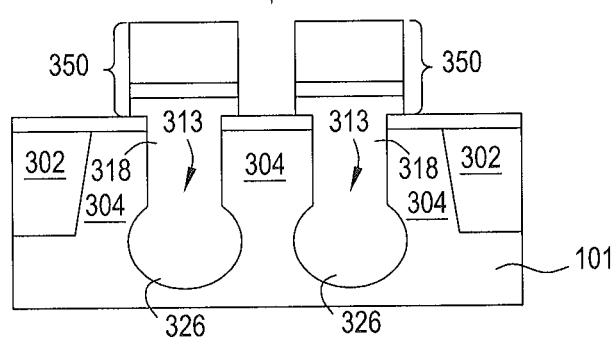

After the photoresist layer 308 is removed, a gate structure 350 may then be formed on the recess channel structure 313 as needed, as shown in FIG. 3D. It is noted that although the recess structure as described herein is utilized to form a channel recess under a gate structure, it is contemplated that the recess structure may be used in any structure, substrates, or any applications as needed.

Thus, a method for manufacturing a recess channel structure in a semiconductor substrate has been provided that advantageously improves manufacture productivity, process control, and feature dimension accuracy. By using one single etching step, a channel recess structure may be formed in a semiconductor substrate in a single processing chamber. The method of forming the channel recess structure advantageously facilitates fabrication of channel recess structure to be connected to a gate structure with accurate critical dimensions for advanced memory fabrication and applications.

While the foregoing is directed to embodiments of the present invention, other and further embodiments of the invention may be devised without departing from the basic scope thereof, and the scope thereof is determined by the claims that follow.

The invention claimed is:

1. A method of forming a recess structure in a semiconductor substrate, comprising:
    transferring a silicon substrate into a processing chamber having a patterned photoresist layer disposed thereon exposing a portion of the substrate;
    providing an etching gas mixture including a halogen containing gas and a $Cl_2$ gas into the processing chamber;
    supplying a RF source power to form a plasma from the etching gas mixture; and
    supplying a pulsed RF bias power in the etching gas mixture; and
    etching the portion of the silicon substrate exposed through the patterned photoresist layer in the presence of the plasma.

2. The method of claim 1, wherein the silicon substrate includes shallow trench isolations formed therein defining an active region exposed through the patterned photoresist layer.

3. The method of claim 2, wherein etching the exposed portion of the silicon substrate further comprises:
    etching the active region defined between shallow trench isolations formed in the silicon substrate.

4. The method of claim 1, wherein supplying the pulsed RF bias power further comprises:
    performing an anisotropic etching process to etch the silicon substrate when the RF bias power is on.

5. The method of claim 1, wherein supplying the pulsed RF bias power further comprises:
    performing an isotropic etching process to etch the silicon substrate when the RF bias power is off.

6. The method of claim 4, wherein performing the anisotropic etching process further comprises:
    forming a trench with a substantially vertical sidewall profile in the silicon substrate.

7. The method of claim 5, wherein performing the isotropic etching process further comprises:
    forming a spherical-like structure in the silicon substrate.

8. The method of claim 1, wherein the halogen containing gas is selected from a group consisting of HBr, $CF_4$, $CHF_3$, $CH_2F_2$, $C_2F_6$, $C_2F_8$, $C_4F_6$, $SF_6$, and $NF_3$.

9. The method of claim 1, wherein the halogen containing gas is HBr gas.

10. The method of claim 9, wherein the etching gas mixture has a $HBr:Cl_2$ ratio between about 5:1 and about 1:5.

11. The method of claim 1, wherein supplying the RF bias power further comprises:
    providing a plasma bias power of less than about 350 Watts.

12. The method of claim 1, wherein the duty cycle of the pulsed RF bias power is controlled between about 5 percent and about 50 percent.

13. The method of claim 1, wherein the etching gas mixture further comprises a carbon and halogen containing gas selected from at least one of $CF_4$, $CHF_3$, $CH_2F_2$, $C_2F_6$, $C_2F_8$ and $C_4F_6$.

14. A method of forming a recess structure in a semiconductor substrate, comprising:
    providing a silicon substrate into a processing chamber, wherein the silicon substrate has a patterned photoresist layer disposed thereon, exposing an active region formed in the silicon substrate, wherein the active region is defined between shallow trench isolations (STI) in the silicon substrate;
    supplying an etching gas mixture in the processing chamber;
    supplying a RF source power to form a plasma from the etching gas mixture; and
    performing an anisotropic etching process by applying a RF bias power in the etching gas mixture; and
    performing an isotropic etching process by turning off the RF bias power in the etching gas mixture.

15. The method of claim 14, further comprising:
    continuously pulsing the RF bias power to repeatedly perform the anisotropic etching process and the isotropic etching process.

16. The method of claim 14, wherein the anisotropic etching process forms a trench with a vertical sidewall in the active region of the silicon substrate.

17. The method of claim 14, wherein the isotropic etching process forms a round bottom feature to the end of the trench in the active region of the silicon substrate.

18. The method of claim 15, wherein the pulsed RF bias power has a duty cycle between about 5 percent and about 50 percent.

19. A method of forming a recess structure in a semiconductor substrate, comprising:
    (a) providing a silicon substrate into a processing chamber, wherein the silicon substrate has a patterned photoresist layer disposed thereon, exposing an active region formed in the silicon substrate, wherein the active region is defined between shallow trench isolations (STI) in the silicon substrate;
    (b) etching the active region in the silicon substrate with a RF bias power on to form a trench in the active region; and
    (c) continuously etching the active region in the silicon substrate with the RF bias off to form a round feature to a bottom of the trench in the active region.

20. The method of claim 19, further comprising:
    repeatedly performing steps (b) and (c) until a desired dimension of the trench and the round feature is formed in the active region of the silicon substrate.

* * * * *